United States Patent [19]

Zielinski et al.

[11] Patent Number: 5,550,670
[45] Date of Patent: Aug. 27, 1996

[54] ELECTRO-OPTIC MODULATOR USING MULTIPLE QUANTUM WELL STRUCTURE HAVING STARK-EFFECT QUANTUM BARRIERS AND NON-STARK-EFFECT QUANTUM BARRIERS SANDWICHED THEREBETWEEN

[75] Inventors: Erich Zielinski, Remseck; Gerhard Weiser, Marburg, both of Germany

[73] Assignee: Alcatel N.V., Netherlands

[21] Appl. No.: 231,265

[22] Filed: Apr. 22, 1994

[30] Foreign Application Priority Data

Apr. 24, 1993 [DE] Germany ............... 43 13 488.2

[51] Int. Cl.⁶ ................................................. G02F 1/015
[52] U.S. Cl. .......................... 359/248; 359/295; 257/21; 257/184; 257/656
[58] Field of Search ..................... 359/248, 245; 372/45, 50; 257/21, 17, 184, 656

[56] References Cited

U.S. PATENT DOCUMENTS

| | | | |
|---|---|---|---|
| 5,008,717 | 4/1991 | Bar-Joseph et al. | 359/321 |
| 5,017,974 | 5/1991 | Greene | 359/321 |
| 5,105,301 | 4/1992 | Campi | 359/245 |
| 5,291,034 | 3/1994 | Allam et al. | 257/17 |

FOREIGN PATENT DOCUMENTS

| | | |
|---|---|---|
| 0380072 | 8/1990 | European Pat. Off. |
| 0483687 | 5/1992 | European Pat. Off. |

OTHER PUBLICATIONS

"InGaAlAs Multiple Quantum Well Optical Modulators" by K. Wakita et al-NTT Opto-Elecgtronics Laboratories, pp. 115–116.

"Optical study of the electronic states of $In_{0.53}Ga_{0.47}As/In_{0.52}Al_{0.48}As$ quantum wells in high electric fields" by K. Satzke, et al–Physical Review B, vol. 43, No. 3, 15 Jan. 1991–1991 The American Physical Society. pp. 2263–2271.
IEEE Journal of Quantum Electronics., Bd.27, Nr.3, März 1991, NEW YORK US Seiten 702–707, XP000227522 Y.C. Chan et al. "Field induced optical effects in coupled quantum wells", pp. 702–707.
Journal of Applied Physics, Bd.65, Nr.1, 1. Jan. 1989, NEW YORK US Seiten 383–385, XP000098015 N. Debbar et al. "Coupled GaAs/AlGaAs quantum-well electroabsorption modulators for low–electric–field optical modulation", pp. 383–385.

*Primary Examiner*—David C. Nelms
*Assistant Examiner*—Andrew Q. Tran
*Attorney, Agent, or Firm*—Ware, Fressola, Van Der Sluys & Adolphson

[57] ABSTRACT

An optoelectronic semiconductor component (1) for modulating a supplied light beam is described, where the optoelectronic semiconductor component has a pin-structure (2, 3, 4). The invention provides that M semiconductor structures with carriers localized in at least one dimension (Q1–Q20; CB1–CB10) are arranged in at least two groups (G1–G10), where the semiconductor structures with carriers localized in at least one dimension belonging to one group (G1–G10), are separated by barriers (CB1–CB10), which essentially allow Starkladder transitions between the individual semiconductor structures (Q1–Q20; CB1–CB10) of each group (G1–G10), and the individual groups (G1–G10) of such coupled semiconductor structures (Q1–Q20; CB1–CB10) are separated by other barriers (B1–B11), which essentially prevent Stark-ladder transitions between the active layers (Q1–Q20) of the semiconductor structures (Q1–Q20; CB1–CB10) of a group (G1–G10) and an active layer (Q1–Q20) of another group.

14 Claims, 4 Drawing Sheets

ELECTRO-OPTIC MODULATOR USING MULTIPLE QUANTUM WELL STRUCTURE HAVING STARK-EFFECT QUANTUM BARRIERS AND NON-STARK-EFFECT QUANTUM BARRIERS SANDWICHED THEREBETWEEN

TECHNICAL FIELD

The invention concerns an optoelectronic semiconductor component for modulating a light beam, where the optoelectronic semiconductor component contains a PIN-structure, whose intrinsic region contains a number of M semiconductor structures with carriers localized in at least one dimension in an active layer, where each two neighboring active layers of the semiconductor structures with carriers localized in at least one dimension are separated by a barrier, and where a control voltage can be applied through an n-doped and a p-doped layer of the PIN structure, for producing an electrical modulation field through the M semiconductor structures with carriers localized in at least one dimension in the active layers.

BACKGROUND OF THE INVENTION

Such an optoelectronic semiconductor component is known and is used to modulate the intensity of the light beam supplied to the optoelectronic semiconductor component. Quantum films are used as semiconductor structures with carriers localized in at least one dimension, which are isolated from each other by respective barriers. The quantum-supported Stark effect is used to modulate the intensity of the light beam, which causes a change in the absorption spectrum of the optoelectronic semiconductor component in the area of the absorption edge (discontinuity) from the effect of an external field: the displacement of energy from the heavy hole and electron of the exciton, which determines the absorption in the area of the absorption edge, leads to a strong absorption decrease in the energy range of the original absorption edge, and builds another absorption in the energy range below the energy of the above-named exciton. If the operating wavelength of the light beam going to the optoelectronic semiconductor component is placed in this latter range, it is possible to perform a field-dependent intensity modulation of the light beam through an absorptive and/or an interferometric extinction, by varying the electrical field applied to the p- and n-layer of the optoelectronic semiconductor component.

It is a disadvantage of the known semiconductor component that a number of quantum films, separated by respective barriers, must be used to obtain a sufficiently large effect: the change in intensity of the supplied light beam that can be achieved with one or a few isolated quantum films is insufficient, at least in practice. However, this number of quantum films causes the existing fundamental absorption of each of these individual quantum films to add up to a disadvantageously high total fundamental absorption, so that an unwanted fundamental attenuation of the light beam supplied to the semiconductor component occurs in the zero field case. It is a further disadvantage of the known semiconductor component that a high modulation field is required to sufficiently modulate the supplied light beam.

Optoelectronic semiconductor components for modulating the intensity of the supplied light beam are known, which have a number of quantum films that are only separated by thin barriers. The thus obtained coupling of the quantum films results in a so-called superlattice structure, in which a delocalization of the carriers that are concentrated in the quantum films takes place across the entire superlattice structure, due to the quantum-mechanical tunnel effect. In the zero field case, these expanded conditions of the carriers in the superlattice structure are quickly localized in a few quantum films, due to the effect of an electrical field (Stark localization): this localization of the delocalized carriers across the entire superlattice structure, caused by the electrical field, leads to a strong absorption increase in the center of the soft absorption edge in the zero field case, and to a reduction of the absorption in the upper and lower range of the absorption edge. Due to the so-called Stark-ladder transitions, an absorption increase takes place in the low energy spectrum range of the absorption function of the optoelectronic semiconductor component, which manifests itself in a stronger red shift in the absorption edge than in the case of the quantum-supported Stark effect.

A disadvantage of the Stark localization is that the absorption edge is even blurred in the zero field case due to the Stark-ladder transitions, which in turn leads to an unwanted fundamental attenuation of the light beam supplied to the optoelectronic semiconductor component, and to a decrease in the effect that is used for the modulation, due to the blurred distribution of the oscillation intensity. This disadvantageous effect forces the selection of an operating wavelength of the light beam supplied to the optoelectronic semiconductor component to be far removed from the absorption edge. However, a displacement of the operating wavelength from the energy range immediately in front of the absorption edge to lower energies again has the disadvantage that the change in absorption characteristics caused by the electrical field decreases very quickly.

SUMMARY OF THE INVENTION

To avoid these disadvantages, the invention has the task of developing an optoelectronic semiconductor component of the kind mentioned in the beginning in such a way, that an improved modulation of the supplied light beam can be achieved.

This task is fulfilled according to the invention in that the M semiconductor structures with carriers localized in at least one dimension are arranged in at least two groups, where the semiconductor structures with carriers localized in at least one dimension corresponding to one group are separated by barriers, which essentially permit Stark-ladder transitions between the individual semiconductor structures of each group, and that the individual groups of semiconductor structures coupled in this way are respectively separated by other barriers, which essentially prevent Stark-ladder transitions between the active layers of the semiconductor structures of one group and the active layer of another group.

In an advantageous manner, the measures of the invention achieve that the Stark-ladder transitions, which cause a disadvantageous blurring of the absorption edge of the optoelectronic semiconductor component in the low energy range, are suppressed by several barriers: the arrangement according to the invention of the M semiconductor layers with carriers localized in at least one dimension of an optoelectronic semiconductor component in several isolated groups of coupled semiconductor structures, advantageously limits the Stark-ladder transitions to a value, which is essentially equal to the number of semiconductor structures with carriers localized in at least one dimension in an isolated group. The long-wave tail of the absorption function, which occurs in known optoelectronic semiconductor components with coupled semiconductor structures, is thereby clearly suppressed, so that the fundamental attenuation of the light beam supplied to the optoelectronic semiconductor component is drastically reduced, in an advantageous manner. The little blurring of the transition strength leads to a larger useful effect, so that the efficiency of the intensity modulation is clearly improved. In addition, this efficient modulation advantageously permits the compact construction of an intensity modulator that utilizes the optoelectronic semiconductor component of the invention.

An advantageous development of the invention provides that only two or three coupled semiconductor structures with carriers localized in at least one dimension are included in each group isolated from the remaining groups. This measure of the invention advantageously achieves that the order of the Stark-ladder transitions essentially is a maximum of one or two. This construction according to the invention advantageously avoids to even a higher degree the disadvantageous long-wave tails of the Stark-ladder transitions higher than the second order, while the advantages of the Stark-ladder transitions themselves, namely their quick shifting under the effect of an electrical field, remain intact.

BRIEF DESCRIPTION OF THE DRAWINGS

Further details of the invention can be found in the configuration example, which is described in the following by means of the figures, where.

BEST MODE FOR CARRYING OUT THE INVENTION

Figure 1:
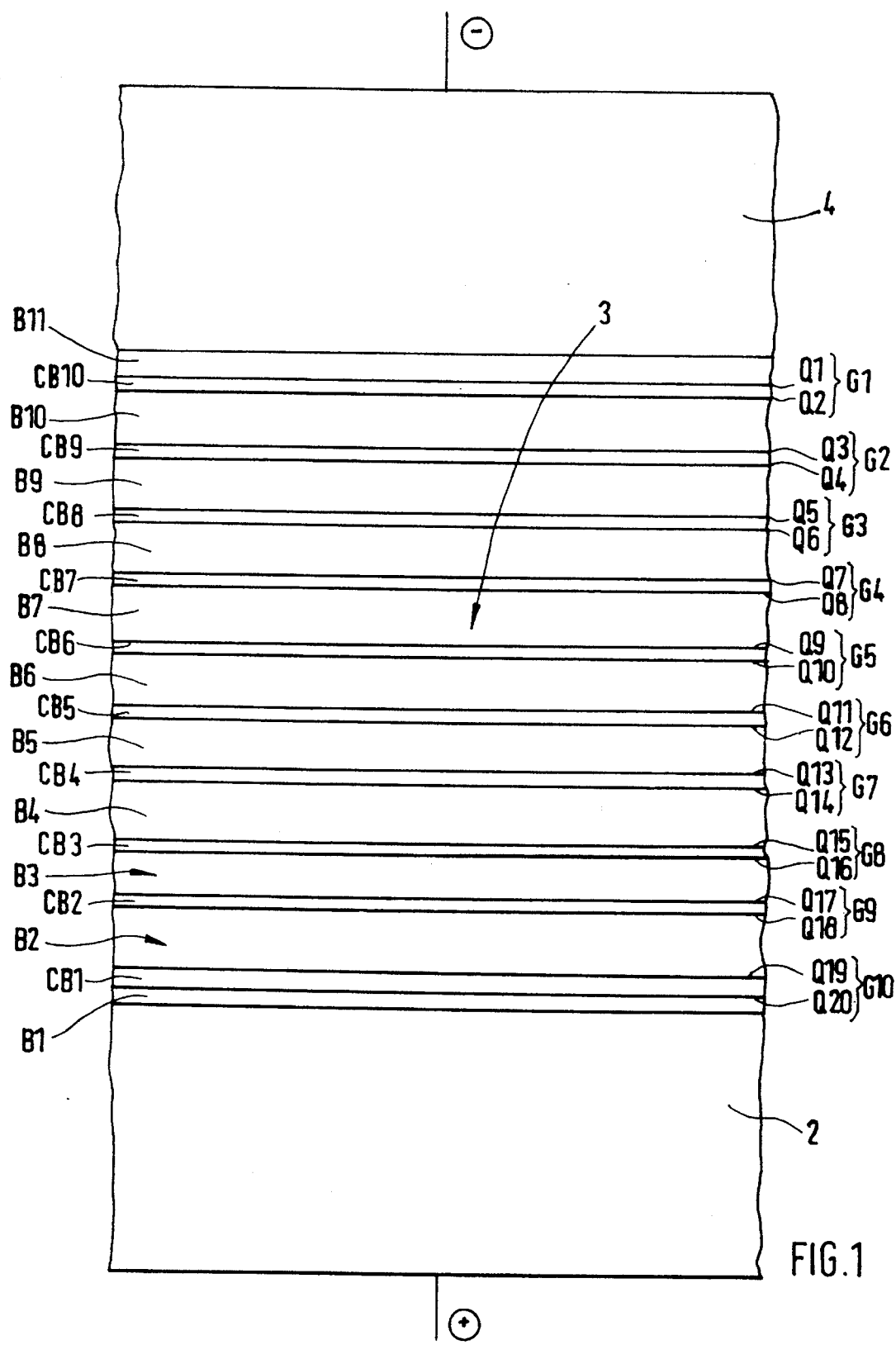
FIG. 1 is a cross section of a configuration example.

The configuration example in FIG. 1 of an optoelectronic semiconductor component 1 for the intensity modulation of a light beam, has a pin-structure and is therefore divided in principle into an n-doped substrate layer 2 consisting of a suitable semiconductor material, an intrinsic layer 3 and a p-doped layer 4. InGaP, InP, InAs, GaAs, AlSb or InSb are preferred as semiconductor materials for the substrate. A variable voltage potential is applied to the n-doped substrate layer 2 and the p-doped substrate layer 4, which respectively function as contact layer, so that the intrinsic layer 3 forms an electrical field.

In the intrinsic layer 3 of the optoelectronic semiconductor component, M=20 are respectively a semiconductor structure with carriers localized in at least one dimension, forming active layers Q1–Q20. The material for the active layers is preferably InGaAs, InGaAsP, InAlGaAs, GaAs, AlGaAs or $Al_xGa_{1-x}As_ySb_{1-y}$. It is however possible to use Group II–VI semiconductor materials, which are preferred for wavelengths of about 400–800 nm, instead of the above named Group III–V semiconductor materials, which are preferred for light beams with a wavelength of about 800–1700 nm.

The geometric thickness of these active layers, which are preferably deposited epitaxially, measures several nanometers; it therefore lies under the scatter length and under the DeBroglie wavelength of the electrons.

In the interest of a concise description, the following assumes that the semiconductor structures with carriers localized in at least one dimension depicted in FIG. 1, are quantum films Q1–Q20 in which a carder occurs in one dimension in an orthogonal direction to the film plane. However, instead of the quantum films, it is also possible to use quantum wires, which form localized carriers in two dimensions, or quantum dots with localized carriers in three dimensions. In the interest of the above named concise description, without limiting the generality of the subsequent explanation, "quantum films" will now replace "semiconductor structures with carriers localized in at least one dimension". However, it is explicitly pointed out that the following reflections also apply 'mutatis mutandis' to quantum wires and quantum dots. In the same way, the arrangement of M=20 quantum films Q1–Q20 shown in FIG. 1, is only intended to be an example. Rather it is possible, as a function of the desired purpose of the use of the optoelectronic semiconductor component and the magnitude of the effect to be achieved, to provide more or less than twenty quantum films Q1–Q20.

As can be seen in FIG. 1, the twenty quantum films Q1–Q20 of intrinsic layer 3 are separated into ten quantum film groups G1–G10 of two quantum films Q1–Q20 each, where the individual quantum film groups G1–G10 are each separated by a respective barrier B1–B11. In this instance it is important that the barriers B1–B11 separating the individual quantum film groups G1–G10 with two quantum films Q1–Q20 each, are constructed so that isolation of the individual quantum film groups G1–G10 can be assured, i.e. that no Starkladder transitions of carriers can take place between the individual quantum film groups G1–G10, under the effect of the electrical field in intrinsic layer 3. This isolation of the quantum film groups G1–G10 is preferably obtained by choosing sufficiently thick barriers B1–B11, so that the carriers localized in the quantum films Q1–Q20 of each quantum film group G1–G10 cannot diffuse into a neighboring quantum film group G1–G10, due to the quantum-mechanical tunnel effect. However, by choosing the barrier material accordingly, it is also possible to prevent a quantum-mechanical diffusion movement of the carriers of one quantum film group G1–G10 into a neighboring quantum film group G1–G10. It is only essential that the barriers B1–B11 are sufficiently thick in the quantum-mechanical sense, so that no, or only a sufficiently small overlapping of the quantum-mechanical wave function of the carriers of a quantum film group takes place with the corresponding wave function of the neighboring group.

By contrast, the other barriers CB1–CB10 arranged between two quantum films Q1 and Q2, or Q3 and Q4, or Q19 and Q20 of each quantum film group G1–G10 are built in such a way, that the quantum films belonging to a quantum film group G1–G10 are coupled, i.e. that the localization of the carriers in the individual quantum films Q1–Q20 is removed, which, in the zero field case, causes a delocalization of the carriers essentially over the entire length L of the superlattice structure formed by the two coupled quantum films Q1–Q10 of a quantum film group G1–G10. It is also possible that, in addition to the intra-quantum film transitions, inter-quantum film transitions, namely Stark-ladder transitions, take place between the coupled quantum films Q1–Q20 of a quantum film group G1–G10, where in the arrangement depicted in FIG. 1, essentially only first order Stark-ladder transitions can take place, i.e. transitions from one quantum film into the other quantum film of the quantum film group.

Figure 2:
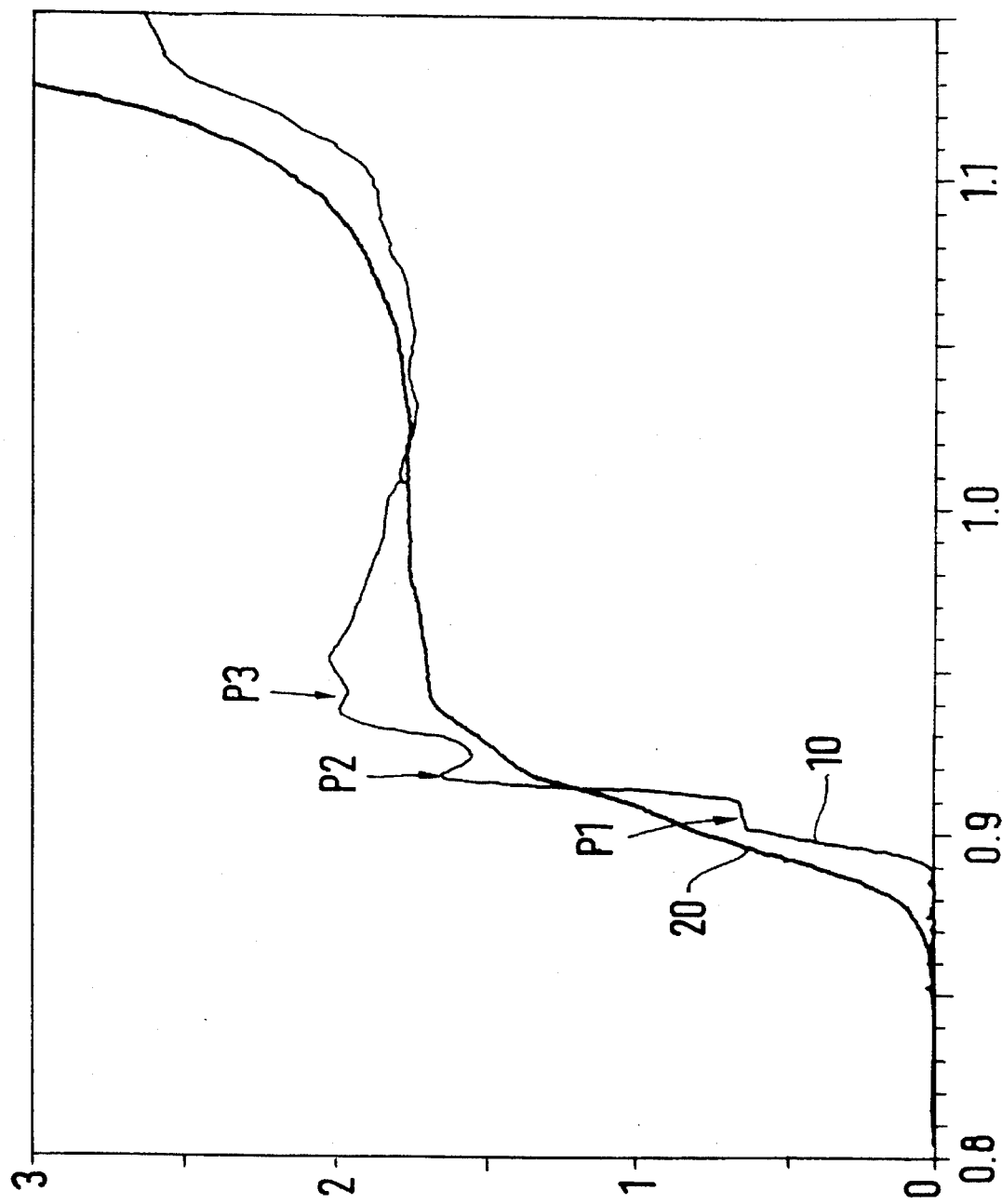
FIG. 2 is a photocurrent spectrum in the zero field case.

As an example, FIG. 2 shows a comparison between an absorption spectrum of the described arrangement and a superlattice structure consisting of twenty coupled quantum films. It must be pointed out that the geometric thickness of the individual quantum films in both arrangements was chosen to be approximately equal. In addition, the coupling between the quantum films of the superlattice structure is essentially of the same size as the coupling between the two quantum films of a quantum film group, which are separated by a quantum-mechanically thin barrier.

In the diagram in FIG. 2, the abscissa illustrates the light energy in electron volts (eV) and thereby the wavelength of the light beam supplied to the optoelectronic component. The ordinate depicts the measured photocurrent in random units. A photocurrent curve 10 now represents the absorption function, resulting from the described ten isolated quantum film groups G1–G10 with two coupled quantum films each. A photocurrent curve 20 in FIG. 2 shows the absorption function of the superlattice structure consisting of twenty coupled quantum films. It is easy to recognize the clearly softer process of the absorption function represented by the photocurrent curve 20, which is a result of the electronic excitation across several quantum-mechanically thin barriers of the superlattice structure, thus the result of higher than first order Stark-ladder transitions.

Figure 3:
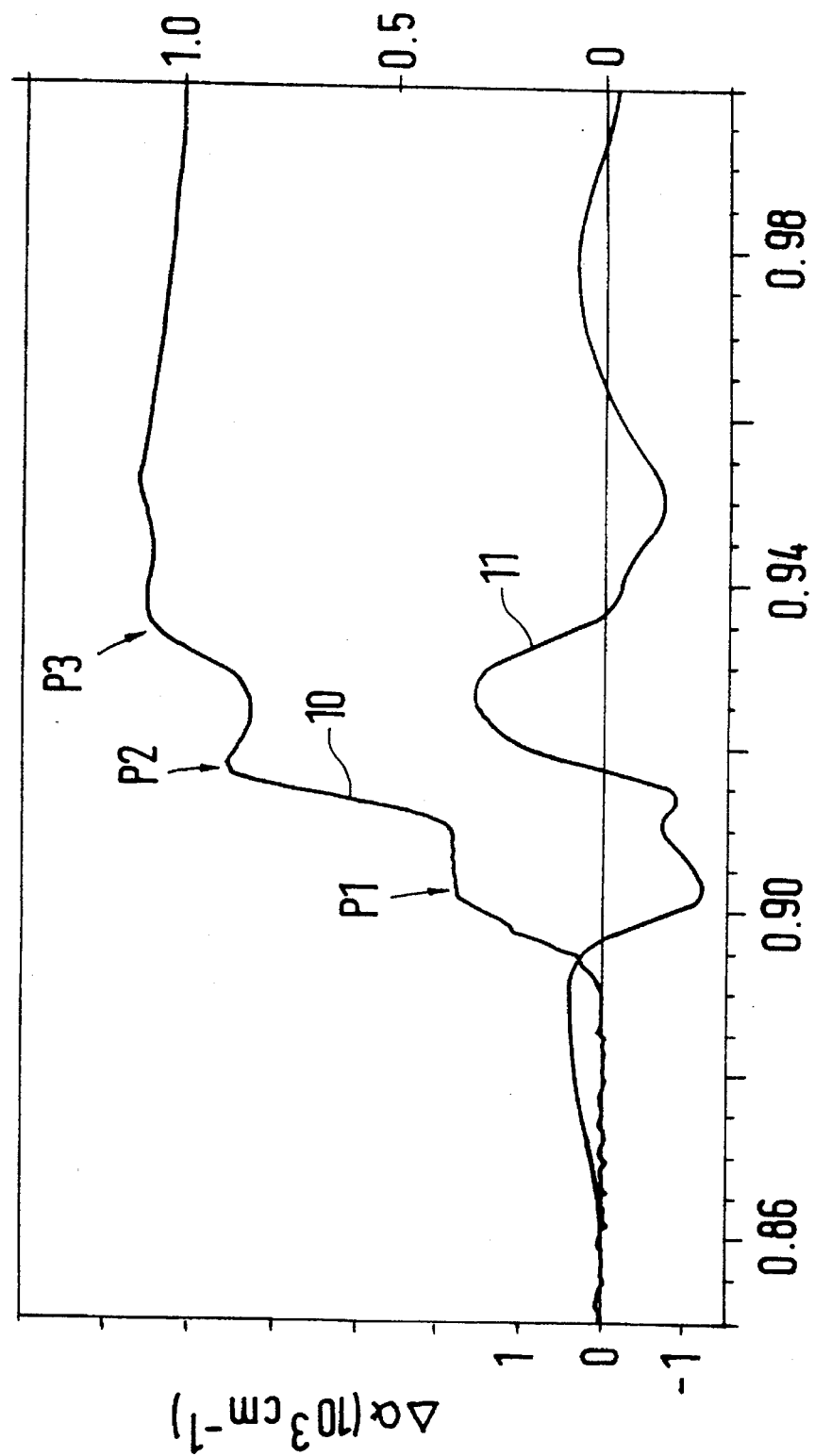
FIG. 3 is a photocurrent spectrum in a modulated electrical field.
Figure 4:
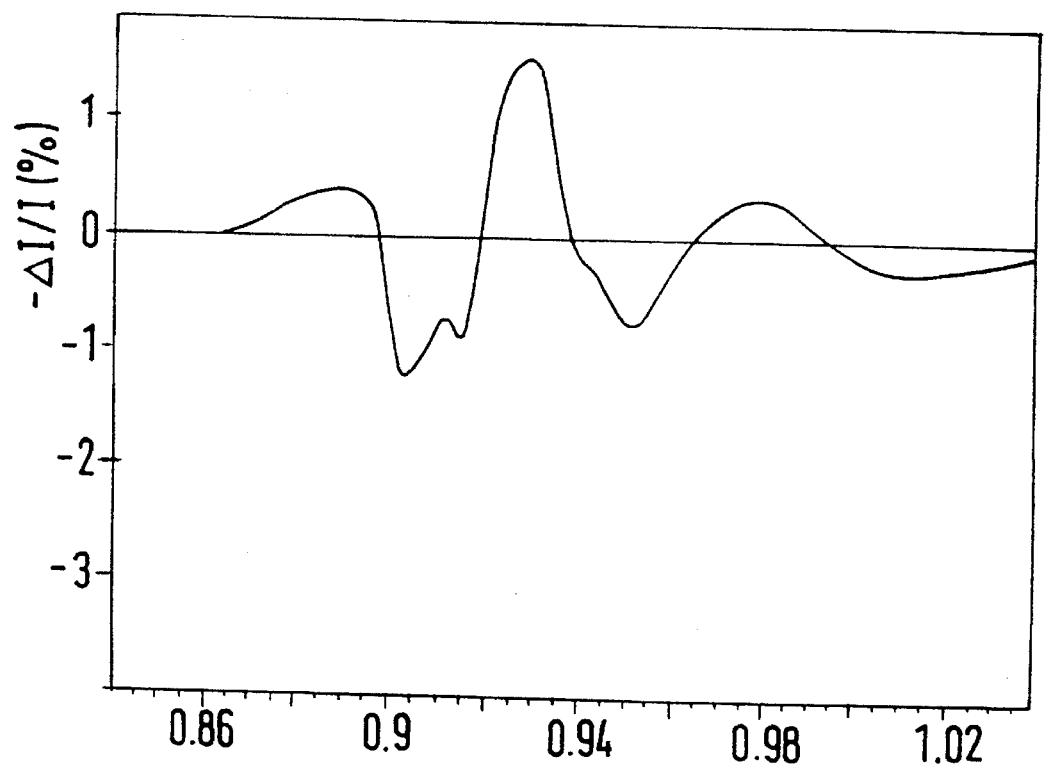
FIG. 4 is a transmission spectrum of the supplied light beam.

As is clearly shown by the photocurrent curve 10 in FIG. 2, this long-wave tail does not occur in the absorption spectrum of the described quantum film arrangement, since only transitions through one barrier are possible with the provided arrangement of twenty quantum films Q1–Q20 in ten isolated quantum film groups G1–G10, thus only through the barrier CB1–CB10 placed between the two quantum films of a quantum film group G1–G10. As a result, essentially only Stark-ladder transitions of the first order occur between the isolated quantum films of a quantum film group, which manifests themselves by a peak P1 at about 0.9 eV in the photo spectrum and in the absorption or transmission spectra described below (FIGS. 3, 4). Two other peaks P2, P3 at about 0.91 eV and 0.95 eV represent the intra-quantum film transitions brought about by the quantum-supported Stark effect. In addition, the stronger structure of photocurrent curve 10 clearly demonstrates that the distribution of the oscillation strength, which is directly proportional to the energy distribution of the absorption strength, is clearly smaller in the described optoelectronic component 1 than in photocurrent curve 20, which represents the superlattice structure consisting of twenty coupled quantum films.

Thus, a comparison of the two photocurrent curves 10 and 20 immediately shows that in the described arrangement the long-wave tails of the absorption caused by higher than the first order Stark-ladder transitions, which occur in the superlattice structure, are not present. It is therefore advantageously possible, for modulating the light beam supplied to the optoelectronic component 1, to place its operating wavelength immediately in the energy range that precedes the first order Stark-ladder transitions (0.88 to 0.9 eV), in other words before peak P1, without a high disrupting fundamental absorption, such as takes place in the superlattice structure.

FIG. 3 contains the photocurve 10 of FIG. 2 and a differential curve 11, which represents the $\Delta\alpha$ change of the absorption coefficient or the photocurrent of the optoelectronic component 1, which results from the application of an electrical modulation field (see below). In this instance the left ordinate indicates the absorption coefficient in units of $10^3$ cm$^{-1}$, and the right ordinate the photocurrent in random units. The relationship between the units of the left and the right ordinates was chosen in such a way, that one unit in the right ordinate corresponds to about $10^4$ cm$^{-1}$.

FIG. 4 now illustrates the change in the transmitted intensity of the light beam supplied to the optoelectronic component 1, which in turn is depicted in eV units in the abscissa. The ordinate of the diagram in FIG. 4 depicts the percentage of the negative quotient of the change in the intensity $\Delta I$ of the transmitted light beam and its intensity I, which results from a modulation voltage of $\Delta U=\pm 1V$ applied to the layers 2, 4 of the described optoelectronic semiconductor component 1. It should be noted here that the "zero field" concept comprises both the case of a missing external electrical modulation field and the case of a small external modulation field, in which the attenuation of the light beam supplied to the optoelectronic semiconductor component 1 is negligible for the respective application purpose.

From this spectrum of the modulated transmission $\Delta I/I$ can be recognized that a long-wave absorption is created by the effect of this electrical modulation field in the energy range of about 0.865 to about 0.88 eV, which does not exist in the zero field case, as can be seen in the photocurrent curves 10 of FIGS. 2 and 3. The increase in this absorption is immediately recognizable in FIG. 3, which illustrates the path of the absorption curve. This increase in absorption in the described energy range manifests itself in FIG. 4 by the rising path of the quotient function $-\Delta I/I$, which represents a decreasing transmission.

A redistribution of the transition strength, and thereby of the absorption strength, takes place in the energy range of 0.8 eV to 0.89 eV, since the electrical modulation field creates a redistribution of the transition strength between the three peaks P1–P3: peak P1, which is created in the transmission or the absorption spectrum by the inter-quantum film transition, therefore by the Stark-ladder transition between two neighboring quantum films of a quantum film group, loses strength, which benefits the intra-quantum film transitions. This redistribution takes place through the Stark localization of the carrier conditions, which increases with the field.

Thus, the spectra in FIGS. 3 and 4 show that the described grouped superlattice structure is advantageously suited for modulating the intensity of a light beam supplied to the optoelectronic semiconductor component 1. By limiting the Stark-ladder transitions to transitions of the first order, no long-wave absorption tail created by such inter-quantum film transitions of a higher order takes place in the low energy range, which otherwise would lead to an unexpected and detrimental fundamental absorption. Under the influence of an electrical modulation field, a rapid redistribution takes place of the absorption strength located before the absorption edge, into smaller energies, which causes an advantageous absorption in an energy range in which no such absorption occurs in the zero field case.

The described arrangement of the quantum films in the optoelectronic semiconductor component 1 thus advantageously permits a field-dependent change in the absorption coefficient, which takes place through the Kramers-Kronig relation with a change in the index of refraction of the quantum film "heter" structure for the incoming light beam. It is therefore possible with the described optoelectronic component to achieve an intensity modulation of the incoming light beam both through absorptive as well as through interferometric effects. This fact results in a wide inlet range of the described optoelectronic component 1. It is possible to use the optoelectronic component 1 in an absorption modulator or in a phase modulator. Such special arrangements could be a Mach-Zehnder (heterodyne) interferometer or a directional coupler.

In conclusion, it should be noted that the described arrangement of two quantum films in a quantum film group is not required. It is also possible, as a function of the desired purpose of utilization, to join three or more quantum films in a quantum film group, in which case the transitions contributing to the interesting part of the absorption spectrum have the maximum order of the number of quantum films of a quantum film group. Nor is it necessary that all quantum film groups G1–G10 of intrinsic layer 3 of the optoelectronic component 1 have the same number of quantum films Q1–Q20. From the above description, the professional can envision a number of possibilities for modifying the arrangement of the configuration example illustrated in FIG. 1 for the desired purpose of use.

What is claimed is:

1. An optoelectronic semiconductor component (1) for modulating a light beam, said optoelectronic semiconductor component having a PIN structure (2, 3, 4) whose intrinsic region (3) contains M semiconductor structures with carriers localized in at least one dimension in an active layer (Q1–Q20), where M is an integer greater than three, with every two adjacent active layers (Q1–Q20) separated by a barrier (B1–B11; CB1–CB10), and with a control voltage for generating an electric modulation field being applied across the M semiconductor structures through an n-type layer (2) and a p-type layer (4) of the PIN structure, characterized in that the M semiconductor structures with carriers localized in at least one dimension (Q1–Q20; CB1–CB10) are arranged in at least two groups (G1–G10), with the semiconductor structures of each of the groups separated by barriers (CB1–CB10) which permit essentially Stark-ladder transitions of the first order between the individual semiconductor structures (Q1–Q20; CB1–CB10) of each group (G1–G10), and that the individual groups (G1–G10) of such coupled semiconductor structures (Q1–Q20; CB1–CB10) are separated from each other by an additional barrier (B1–B11) which prevents essentially Stark-ladder transitions between the active layers (Q1–Q20) of the semiconductor structures (Q1–Q20; CB1–CB10) of one group (G1–G10) and an active layer (Q1–Q20) of another group.

2. An optoelectronic semiconductor component as claimed in claim 1, characterized in that at least one of the isolated groups (G1–G10) of the intrinsic region (3) of the optoelectronic semiconductor component contains only two or three active layers (Q1–Q20).

3. An optoelectronic semiconductor component as claimed in claim 2, characterized in that all groups (G1–G10) of the intrinsic region (3) of the optoelectronic semiconductor component contain only two or three active layers (Q1–Q20).

4. An optoelectronic semiconductor component as claimed in claim 1, characterized in that the geometrical thickness of the active layers (Q1–Q20) lies in the nanometer range.

5. An optoelectronic semiconductor component as claimed in claim 4, characterized in that the active layers (Q1–Q20) are epitaxially deposited on the semiconductor substrate (2).

6. An optoelectronic semiconductor component as claimed in claim 1, characterized in that the operating wavelength of the light beam lies in the energy band of the peak (P1) of a photocurrent spectrum (10) of the optoelectronic semiconductor component caused by the first-order Stark-ladder transitions.

7. An optoelectronic semiconductor component as claimed in claim 1, characterized in that the active layers (Q1–Q20) are implemented as quantum films.

8. An optoelectronic semiconductor component as claimed in claim 1, characterized in that the semiconductor substrate is selected from the group consisting of GaP, InP, InAs, GaAs, GaSb, AlSb and InSb.

9. An optoelectronic semiconductor component as claimed in claim 1, characterized in that at least one of the layers (Q1–Q20) is selected from the group consisting of InGaAs, InGaAsP, InAlGaAs, GaAs, AlGaAs and $Al_xGa_{1-x}As_ySb_{1-y}$.

10. An optoelectronic semiconductor component as claimed in claim 1, characterized in that the active layers (Q1–Q20) are implemented as quantum wires.

11. An optoelectronic semiconductor component as claimed in claim 1, characterized in that the active layers (Q1–Q20) are implemented as quantum dots.

12. An optoelectronic semiconductor component as claimed in claim 1, characterized in that at least one of the layers (Q1–Q20) is made of a Group II–VI semiconductor material.

13. An absorption modulator (1) for modulating a light beam, said absorption modulator having a PIN structure (2, 3, 4) whose intrinsic region (3) contains M semiconductor structures with carriers localized in at least one dimension in an active layer (Q1–Q20), where M is an integer greater than three, with every two adjacent active layers (Q1–Q20) separated by a barrier (B1–B11; CB1–CB10), and with a control voltage for generating an electric modulation field being applied across the M semiconductor structures through an n-type layer (2) and a p-type layer (4) of the PIN structure, characterized in that the M semiconductor structures with carriers localized in at least one dimension (Q1–Q20; CB1–CB10) are arranged in at least two groups (G1–G10), with the semiconductor structures of each of the groups separated by barriers (CB1–CB10) which permit essentially Stark-ladder transitions of the first order between the individual semiconductor structures (Q1–Q20; CB1–CB10) of each group (G1–G10), and that the individual groups (G1–G10) of such coupled semiconductor structures (Q1–Q20; CB1–CB10) are separated from each other by an additional barrier (B1–B11) which prevents essentially Stark-ladder transitions between the active layers (Q1–Q20) of the semiconductor structures (Q1–Q20; CB1–CB10) of one group (G1–G10) and an active layer (Q1–Q20) of another group.

14. A phase modulator (1) for modulating a light beam, said phase modulator having a PIN structure (2, 3, 4) whose intrinsic region (3) contains M semiconductor structures with carriers localized in at least one dimension in an active layer (Q1–Q20), where M is an integer greater than three, with every two adjacent active layers (Q1–Q20) separated by a barrier (B1–B11; CB1–CB10), and with a control voltage for generating an electric modulation field being applied across the M semiconductor structures through an n-type layer (2) and a p-type layer (4) of the PIN structure, characterized in that the M semiconductor structures with carriers localized in at least one dimension (Q1–Q20; CB1–CB10) are arranged in at least two groups (G1–G10), with the semiconductor structures of each of the groups separated by barriers (CB1–CB10) which permit essentially Stark-ladder transitions of the first order between the individual semiconductor structures (Q1–Q20; CB1–CB10) of each group (G1–G10), and that the individual groups (G1–G10) of such coupled semiconductor structures (Q1–Q20; CB1–CB10) are separated from each other by an additional barrier (B1–B11) which prevents essentially Stark-ladder transitions between the active layers (Q1–Q20) of the semiconductor structures (Q1–Q20; CB1–CB10) of one group (G1–G10) and an active layer (Q1–Q20) of another group.

* * * * *